US012727439B2

(12) United States Patent
Honma et al.

(10) Patent No.: US 12,727,439 B2
(45) Date of Patent: Sep. 1, 2026

(54) SUBSTRATE PROCESSING APPARATUS

(71) Applicant: Tokyo Electron Limited, Tokyo (JP)

(72) Inventors: Manabu Honma, Iwate (JP); Junnosuke Taguchi, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 433 days.

(21) Appl. No.: 18/363,993

(22) Filed: Aug. 2, 2023

(65) Prior Publication Data

US 2024/0060181 A1 Feb. 22, 2024

(30) Foreign Application Priority Data

Aug. 22, 2022 (JP) ................................ 2022-131662

(51) Int. Cl.
*H10P 72/76* (2026.01)
*C23C 16/458* (2006.01)

(52) U.S. Cl.
CPC ...... *H10P 72/7626* (2026.01); *C23C 16/4581* (2013.01); *H10P 72/7618* (2026.01); *H10P 72/7621* (2026.01)

(58) Field of Classification Search
CPC ............ C23C 16/4581; C23C 16/4584; C23C 16/4586; H01J 37/32715; H01J 37/32724; H01L 21/67103; H01L 21/68764; H01L 21/68771; H01L 21/68792; H10P 72/0432; H10P 72/7618; H10P 72/7621; H10P 72/7626
See application file for complete search history.

(56) References Cited

U.S. PATENT DOCUMENTS 6,074,696 A * 6/2000 Sato .................... C23C 16/4584 427/248.1
2016/0091014 A1* 3/2016 Huang .............. H01L 21/68792 403/165
2021/0217651 A1* 7/2021 Taguchi ............ H01L 21/67109

FOREIGN PATENT DOCUMENTS

JP 2021-110023 8/2021

* cited by examiner

*Primary Examiner* — Benjamin Kendall
(74) *Attorney, Agent, or Firm* — IPUSA, PLLC

(57) ABSTRACT

A substrate processing apparatus includes a vacuum chamber, a rotary table in the vacuum chamber, a stage, and a support that supports at least either the rotary table or stage, the support having a thermal expansion coefficient greater than the rotary table or stage that is supported. The rotary table or stage includes a protruding portion protruding toward the support. The support includes a base portion, an insertion portion protruding from a center of the base portion and being inserted into the protruding portion, and an outer edge protruding portion protruding from the base portion. An outer clearance formed between the outer edge protruding portion and the protruding portion is set to be smaller than an inner clearance formed between the insertion portion and the protruding portion at a first temperature, and the outer clearance becomes greater than the inner clearance at a second temperature higher than the first temperature.

6 Claims, 5 Drawing Sheets

1
11
111
112
113
114
114a
115
116
10
15
151
152
153
154
16
161a
161b
161c
161d
162a
162b
162c
163a
163b
163c
163d
164a
164b
164c
164d
19
20
21
211
212
213
214
22
221
222
223
224
23
231
24
25
263
30
31
40
50
51
90
W
CHILLER UNIT
CHILLER UNIT
CHILLER UNIT
CHILLER UNIT
CONTROLLER
REVOLUTION MOTOR 215
211
216
216f
218a
218b
218
212
220
216c
66
65
60
62
63
61
217a
217b
219
217

SUBSTRATE PROCESSING APPARATUS

CROSS-REFERENCE TO RELATED APPLICATIONS

This patent application is based on and claims priority to Japanese Patent Application No. 2022-131662 filed on Aug. 22, 2022, the entire contents of which are incorporated herein by reference.

TECHNICAL FIELD

The present disclosure relates to a substrate processing apparatus.

BACKGROUND

Patent Document 1 discloses a substrate processing apparatus including a rotary table that is rotatable in a vacuum chamber, and multiple stages that are rotatable relative to the rotary table and that are configured to mount substrates thereon. The substrate processing apparatus performs substrate processing of depositing a film on each mounted substrate by supplying a processing gas into the processing chamber while rotating the rotary table and each of the multiple stages.

In this type of the substrate processing apparatus, multiple stages are made of a ceramic, and each stage is supported by a metal support (axis of rotation) and rotated. Each stage and each support are greatly affected by a temperature change in the vacuum chamber when the substrate is mounted or processed.

RELATED ART DOCUMENT

Patent Document

[Patent Document 1] Japanese Laid-open Patent Application Publication No. 2021-110023

SUMMARY

According to an aspect of the present disclosure, a substrate processing apparatus includes a vacuum chamber, a rotary table rotatably provided in the vacuum chamber, a stage that has a rotation center at a position spaced apart from a rotation center of the rotary table and that is rotatable relative to the rotary table, and a support configured to support at least either the rotary table or the stage, the support having a thermal expansion coefficient greater than a thermal expansion coefficient of the rotary table or the stage that is supported. The rotary table or the stage includes a protruding portion that protrudes toward the support. The support includes a base portion that supports the protruding portion, an insertion portion that protrudes from a center of the base portion and that is inserted into the protruding portion, and an outer edge protruding portion that protrudes from the base portion outside an outer circumferential surface of the protruding portion. An outer clearance formed between the outer edge protruding portion and the protruding portion is set to be smaller than an inner clearance formed between the insertion portion and the protruding portion at a first temperature, and the outer clearance becomes greater than the inner clearance at a second temperature higher than the first temperature.

BRIEF DESCRIPTION OF THE DRAWINGS

FIG. 5A is an enlarged side-cross-sectional view illustrating a connection structure at a first temperature; and FIG. 5B is an enlarged side cross-sectional view illustrating the connection structure at a second temperature.

DETAILED DESCRIPTION OF EMBODIMENTS

Figure 1:
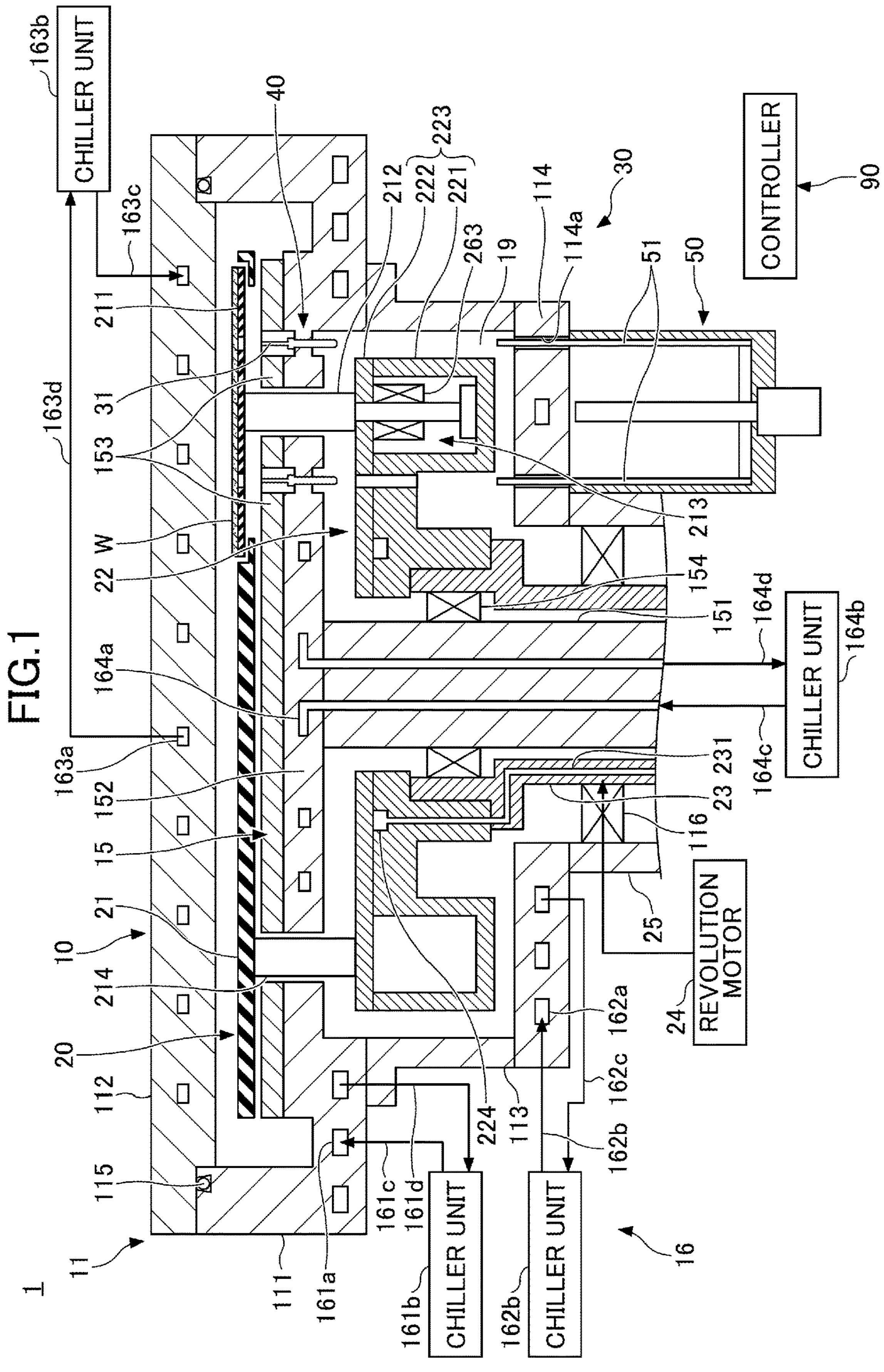
FIG. 1 is a vertical cross-sectional view illustrating a configuration example of a film deposition apparatus according to an embodiment.

In the following, embodiments of the present disclosure will be described with reference to the drawings. In the drawings, the same components are denoted by the same reference symbols, and duplicated description may be omitted.

Figure 2:
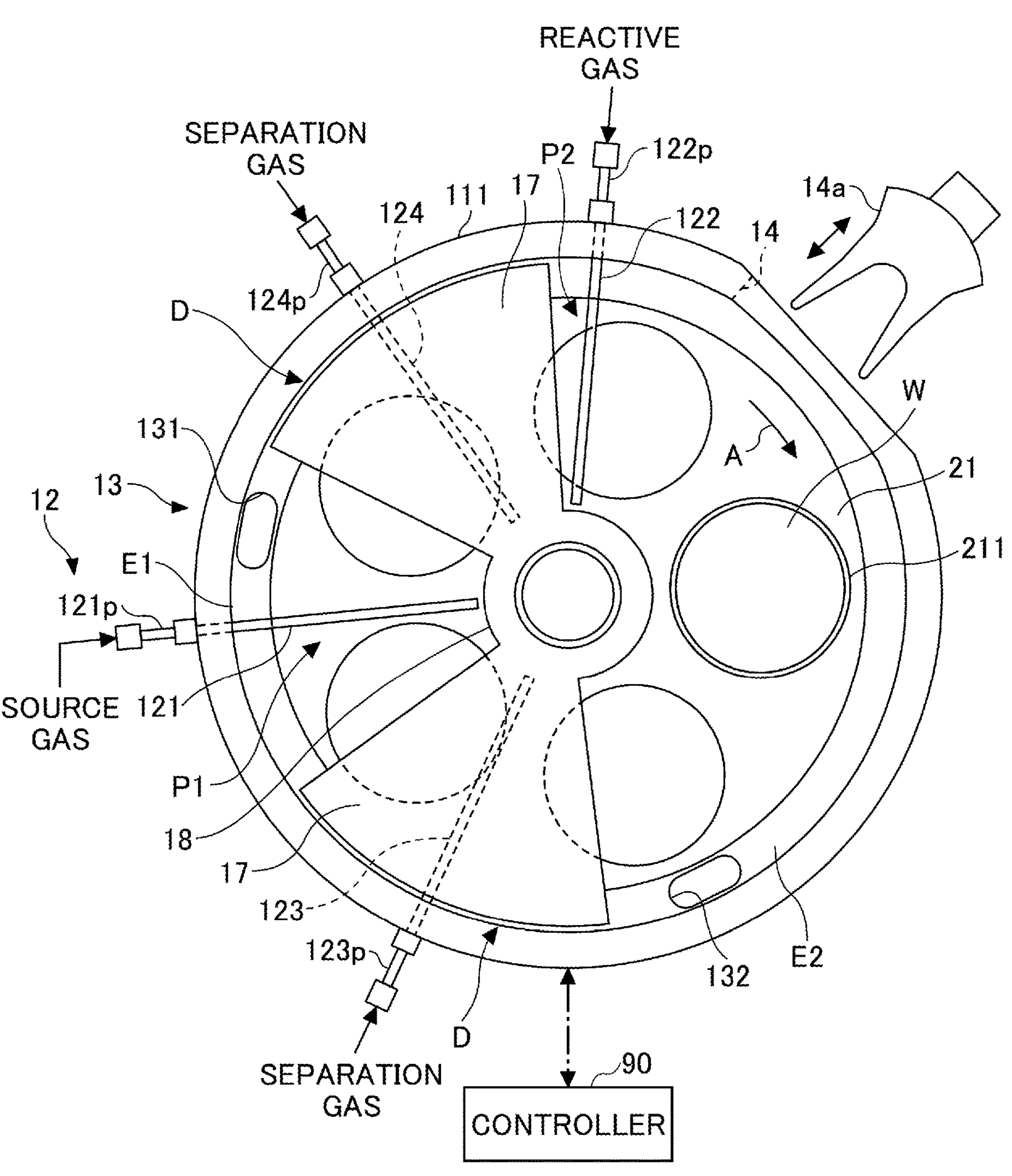
FIG. 2 is a plan view illustrating a configuration in a vacuum chamber of the film deposition apparatus of FIG. 1.
Figure 3:
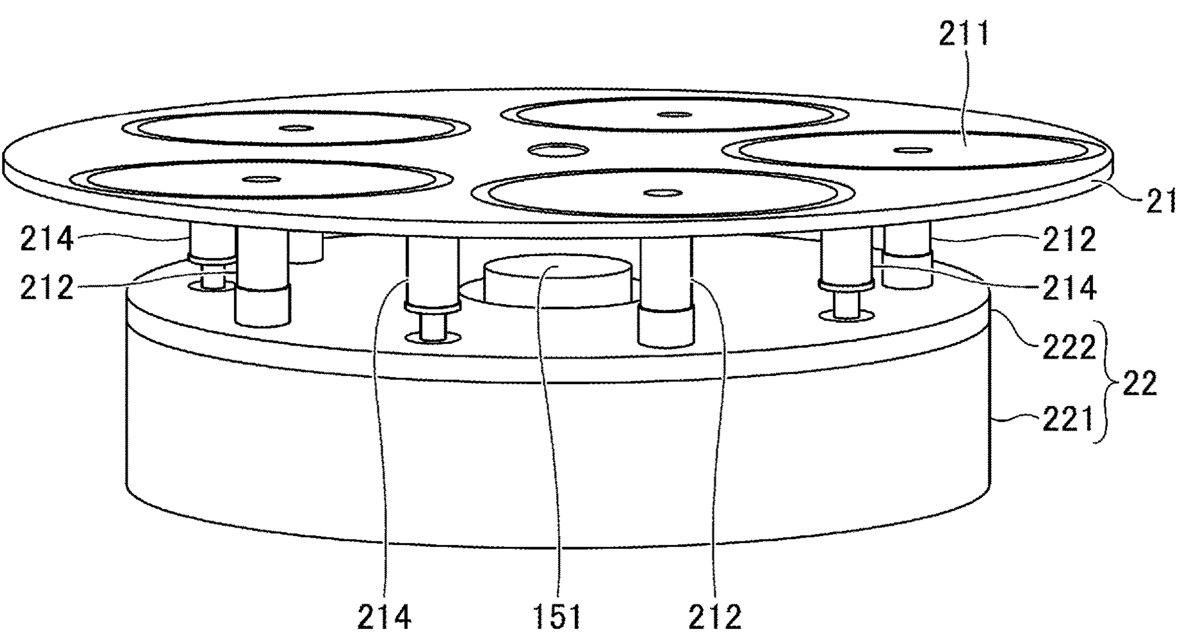
FIG. 3 is a perspective view illustrating a configuration of a rotary table and a stage of the film deposition apparatus of FIG. 1.

A film deposition apparatus 1 that forms a film on a substrate W, which is an example of a substrate processing apparatus, will be described with reference to FIGS. 1 to 3. FIG. 1 is a vertical cross-sectional view illustrating a configuration example of the film deposition apparatus 1 according to an embodiment. FIG. 2 is a plan view illustrating a configuration in a vacuum chamber 11 of the film deposition apparatus 1 in FIG. 1. Here, in FIG. 2, a top plate is not illustrated for convenience of explanation. FIG. 3 is a perspective view illustrating a configuration of a rotary table 21 and a stage 211 of the film deposition apparatus 1 in FIG. 1.

The film deposition apparatus 1 includes a processing section 10, a rotary drive device 20, a lift pin mechanism 30, and a controller 90.

The processing section 10 performs a film deposition process of depositing a film on the substrate W. The processing section 10 includes the vacuum chamber 11, a gas introduction section 12, a gas exhaust section 13, a transfer port 14, a heating section 15, and a cooling section 16.

The vacuum chamber 11 is a processing chamber that can reduce a pressure in an inner space thereof. The vacuum chamber 11 is formed in a flat housing having a substantially circular shape as a planar shape, and can accommodate multiple substrates W in the internal space. The substrate W may be, for example, a semiconductor wafer. The vacuum chamber 11 includes a main body 111, a top plate 112, a sidewall body 113, and a bottom plate 114 (FIG. 1). The main body 111 has a cylindrical shape. The top plate 112 is detachably disposed on the upper surface of the main body 111. The main body 111 and the top plate 112 are airtightly sealed by a seal 115. The sidewall body 113 has a cylindrical shape and is airtightly connected to the lower surface of the main body 111. The bottom plate 114 is air-tightly connected to the bottom surface of the sidewall body 113.

As illustrated in FIG. 2, the gas introduction section 12 includes a source gas nozzle 121, a reactive gas nozzle 122, and separation gas nozzles 123 and 124. The source gas nozzle 121, the reactive gas nozzle 122, and the separation gas nozzles 123 and 124 are disposed above the rotary table 21, which will be described later, spaced apart from each other along a circumferential direction of the vacuum chamber 11 (a direction indicated by an arrow A in FIG. 2). In the illustrated example, the separation gas nozzle 123, the source gas nozzle 121, the separation gas nozzle 124, and the reactive gas nozzle 122 are disposed in this order in a clockwise direction (a rotation direction of the rotary table 21) from the transfer port 14. The source gas nozzle 121, the reactive gas nozzle 122, and the separation gas nozzles 123 and 124 respectively have gas introduction ports 121*p*, 122*p*, 123*p*, and 124*p* for introducing various gases at base ends thereof. The gas introduction ports 121*p*, 122*p*, 123*p*, and 124*p* are fixed to a sidewall of the main body 111 and protrude to the outside of the main body 111. The source gas nozzle 121, the reactive gas nozzle 122, and the separation gas nozzles 123 and 124 are inserted into the vacuum chamber 11 from the sidewall of the main body 111 and extend inward in the radial direction of the main body 111. The source gas nozzle 121, the reactive gas nozzle 122, and the separation gas nozzles 123 and 124 are made of, for example, quartz, and are disposed in parallel to the rotary table 21.

The source gas nozzle 121 is connected to a source gas supply (which is not illustrated) via a pipe, a flow rate controller, and the like (which are not illustrated). As the source gas, for example, a silicon-containing gas or a metal-containing gas may be used. In the source gas nozzle 121, multiple discharge holes (which are not illustrated) opened toward the rotary table 21 are arranged at intervals along the axial direction of the source gas nozzle 121. A region below the source gas nozzle 121 becomes a source gas adsorption region P1 for adsorbing the source gas onto the substrate W.

The reactive gas nozzle 122 is connected to a reactive gas supply (which is not illustrated) via a pipe, a flow rate controller, and the like (which are not illustrated). As the reactive gas, for example, an oxidizing gas or a nitriding gas can be used. In the reactive gas nozzle 122, multiple discharge holes (which are not illustrated) opened toward the rotary table 21 are arranged at intervals along the axial direction of the reactive gas nozzle 122. A region below the reactive gas nozzle 122 becomes a reactive gas supply region P2 in which the source gas adsorbed on the substrate W in the source gas adsorption region P1 is oxidized or nitrided. In the present embodiment, the processing gas for processing the substrate W corresponds to the source gas and the reactive gas described above.

Each of the separation gas nozzles 123 and 124 is connected to a separation gas supply (which is not illustrated) via a pipe, a flow rate control valve, and the like (which are not illustrated). As the separation gas, for example, an inert gas such as argon (Ar) gas or nitrogen gas ($N_2$) gas can be used. In the separation gas nozzles 123 and 124, multiple discharge holes (which are not illustrated) opened toward the rotary table 21 are arranged at intervals along the axial direction of each of the separation gas nozzles 123 and 124.

Additionally, two protruding portions 17 are provided in the vacuum chamber 11. In order to form separation regions D together with the separation gas nozzles 123 and 124, the protruding portion 17 is attached to the back surface of the top plate 112 so as to protrude toward the rotary table 21. Each protruding portion 17 has a fan shape whose top portion is cut in an arc shape as a planar shape, and is disposed such that the inner arc is connected to a central protrusion 18 and the outer arc is along the sidewall of the vacuum chamber 11.

The gas exhaust section 13 includes a first exhaust port 131 and a second exhaust port 132. The first exhaust port 131 is formed at the bottom of a first exhaust region E1 communicating with the source gas adsorption region P1. The second exhaust port 132 is formed at the bottom of a second exhaust region E2 communicating with the reactive gas supply region P2. The first exhaust port 131 and the second exhaust port 132 are connected to an exhaust device (which is not illustrated) via an exhaust pipe (which is not illustrated).

The transfer port 14 is provided in the sidewall of the main body 111. At the transfer port 14, the substrate W is transferred between the rotary table 21 inside the vacuum chamber 11 and a transfer arm 14*a* outside the vacuum chamber 11. The transfer port 14 is opened and closed by a gate valve (which is not illustrated).

As illustrated in FIG. 1, the heating section 15 includes a fixing shaft 151, a heater support 152, and a heater 153.

The fixing shaft 151 has a columnar shape having the center of the vacuum chamber 11 as a central axis. The fixing shaft 151 is provided to pass through the bottom plate 114 of the vacuum chamber 11 on the inner side of a rotary shaft 23 of the rotary drive device 20, which will be described later.

The heater support 152 is fixed to an upper portion of the fixing shaft 151 and has a disc shape. The heater support 152 supports the heater 153.

The heater 153 is provided on an upper surface of the heater support 152. The heater 153 may be provided on the main body 111 in addition to the upper surface of the heater support 152. The heater 153 generates heat by electric power being supplied from a power supply (which is not illustrated) and heats the substrate W. Additionally, a shielding plate (which is not illustrated) is provided on an upper surface of the heater 153. The shielding plate is disposed above the main body 111 or the heater support 152 to prevent the heater 153 from being exposed to the processing gas.

The cooling section 16 includes fluid flow paths 161*a* to 164*a*, chiller units 161*b* to 164*b*, inlet pipes 161*c* to 164*c*, and outlet pipes 161*d* to 164*d* (FIG. 1). The fluid flow paths 161*a* to 164*a* are formed inside the main body 111, the top plate 112, the bottom plate 114, and the heater support 152. The chiller units 161*b* to 164*b* output temperature control fluid. The temperature control fluid output from the chiller units 161*b* to 164*b* flows and circulates through the inlet pipes 161*c* to 164*c*, the fluid flow paths 161*a* to 164*a*, and the outlet pipes 161*d* to 164*d* in this order. This allows the temperatures of the main body 111, the top plate 112, the bottom plate 114, and the heater support 152 to be adjusted. As the temperature control fluid, for example, water or a fluorine-based fluid such as Galden (registered trademark) can be used.

The rotary drive device 20 includes the rotary table 21, an accommodation box 22, the rotary shaft 23, a revolution motor 24, and an outer cylinder 25.

The rotary table 21 is provided in the vacuum chamber 11 and has a rotation center at the center of the vacuum chamber 11. The rotary table 21 has, for example, a disk shape and is made of quartz. Multiple (for example, five) stages 211 are provided on an upper surface of the rotary table 21 along the rotation direction (the circumferential direction). The rotary table 21 is connected to the accommodation box 22 via a connection shaft 214 (see also FIG. 3).

Each stage 211 has a disk shape slightly larger than the substrate W and is made of, for example, quartz. A mounting surface on which the substrate W is mounted is formed on an upper surface of each stage 211. Each stage 211 is connected to a rotation motor 213 via a rotation shaft 212 and is configured to be rotatable relative to the rotary table 21.

The rotation shaft 212 connects a lower surface of the stage 211 and the rotation motor 213 accommodated in the accommodation box 22, and transmits the power of the rotation motor 213 to the stage 211. The rotation shaft 212 is configured to be rotatable around the center of the stage 211. The rotation shaft 212 is provided to pass through a ceiling 222 of the accommodation box 22 and the rotary table 21. A seal 263 is provided in the vicinity of the penetration portion of the ceiling 222 of the accommodation box 22, and an airtight state in the accommodation box 22 is maintained. The seal 263 includes, for example, a magnetic fluid seal.

The rotation motor 213 rotates the stage 211 via the rotation shaft 212 relative to the rotary table 21 to rotate the substrate W around the center of the substrate W. For the rotation motor 213, a servomotor is preferably applied, for example.

As illustrated in FIG. 3, the connection shaft 214 connects the lower surface of the rotary table 21 and the upper surface of the accommodation box 22. Multiple connection shafts 214 are provided along the circumferential direction of the rotary table 21.

The accommodation box 22 is provided below the rotary table 21 inside the vacuum chamber 11. The accommodation box 22 is connected to the rotary table 21 via the connection shaft 214 and rotates together with the rotary table 21. The accommodation box 22 may be configured to be movable up and down inside the vacuum chamber 11 by a raising/lowering mechanism (which is not illustrated). The accommodation box 22 includes a main body 221 and the ceiling 222.

The main body 221 is formed in a U-shape in a vertical cross-sectional view, and is formed in a ring shape along the rotation direction of the rotary table 21.

As illustrated in FIG. 1, the ceiling 222 is provided on the upper surface of the main body 221 so as to cover an opening of the main body 221. With this, the main body 221 and the ceiling 222 form a rotation accommodating section 223 separated from the inside of the vacuum chamber 11.

The rotation accommodating section 223 is formed in a rectangular shape in a vertical cross-sectional view, and has a ring shape along the rotation direction of the rotary table 21. The rotation accommodating section 223 accommodates the rotation motor 213 (a rotation source). In the main body 221, a communication path 224 is formed to allow the rotation accommodating section 223 to communicate with the outside of the film deposition apparatus 1. This allows the atmosphere to be introduced into the rotation accommodating section 223 from the outside of the film deposition apparatus 1, and the inside of the rotation accommodating section 223 is cooled and maintained at the atmospheric pressure. In order to rotatably arrange the rotation accommodating section 223, the vacuum chamber 11 has a rotation source accommodating space 19 surrounded by the sidewall body 113, the bottom plate 114, and the heating section 15.

The rotary shaft 23 is fixed to a lower portion of the accommodation box 22. The rotary shaft 23 is provided to pass through the bottom plate 114 of the vacuum chamber 11. The rotary shaft 23 transmits the power of the revolution motor 24 to the rotary table 21 and the accommodation box 22 to integrally rotate the rotary table 21 and the accommodation box 22. A seal 154 is provided between an outer wall of the fixing shaft 151 and an inner wall of the rotary shaft 23 of the rotary drive device 20. This allows the rotary shaft 23 to rotate with respect to the fixing shaft 151 while maintaining the airtight state in the vacuum chamber 11. A magnetic fluid seal can be applied to the seal 154, for example.

The outer cylinder 25 of the rotary drive device 20 is connected to a lower surface of the bottom plate 114 of the vacuum chamber 11 on the center side. The outer cylinder 25 supports the vacuum chamber 11 together with the fixing shaft 151 of the vacuum chamber 11. A seal 116 is provided between the rotary shaft 23 and the outer cylinder 25 to maintain an airtight state in the vacuum chamber 11. A magnetic fluid seal can be applied to the seal 116, for example.

A path 231 is formed inside the rotary shaft 23. The path 231 is connected to the communication path 224 of the accommodation box 22 and functions as a fluid flow path for introducing the atmosphere into the accommodation box 22. Additionally, the path 231 functions as a wiring duct for introducing a power line and a signal line for driving the rotation motor 213 into the accommodation box 22. The paths 231 are provided such that the number of the paths 231 is equal to the number of the rotation motors 213, for example.

Additionally, when the transfer arm 14*a* (FIG. 2) carries the substrate W to and from the stage 211, the lift pin mechanism 30 raises and lowers multiple (three in the present embodiment) lift pins 31 to receive and deliver the substrate W from and to the transfer arm 14*a*. The film deposition apparatus 1 includes the lift pin mechanism 30 on a lower side of the stage 211 in the vertical direction at a position adjacent to the transfer port 14. The lift pin mechanism 30 includes, in the vacuum chamber 11, multiple (three) upper lift parts 40 each having multiple lift pins 31, and one lower operation part 50 that simultaneously raises the multiple lift pins 31 and simultaneously lowers the multiple lift pins 31.

The upper lift parts 40 are installed so as to pass through the heater support 152 and the heater 153, and accommodate the lift pins 31 in a displaceable manner. The lower operation part 50 is attached to the lower surface of the bottom plate 114 of the vacuum chamber 11. The lower operation part 50 includes multiple (three) plungers 51 that are displaced along the vertical direction to respectively press the lower ends of the lift pins 31. That is, the lift pin mechanism 30 has a two-stage structure in which multiple lift pins 31 that directly contact the substrate W and multiple plungers 51 that indirectly raise and lower the substrates W via the lift pins 31 are included as operating members and are vertically separated from each other.

Figure 4:
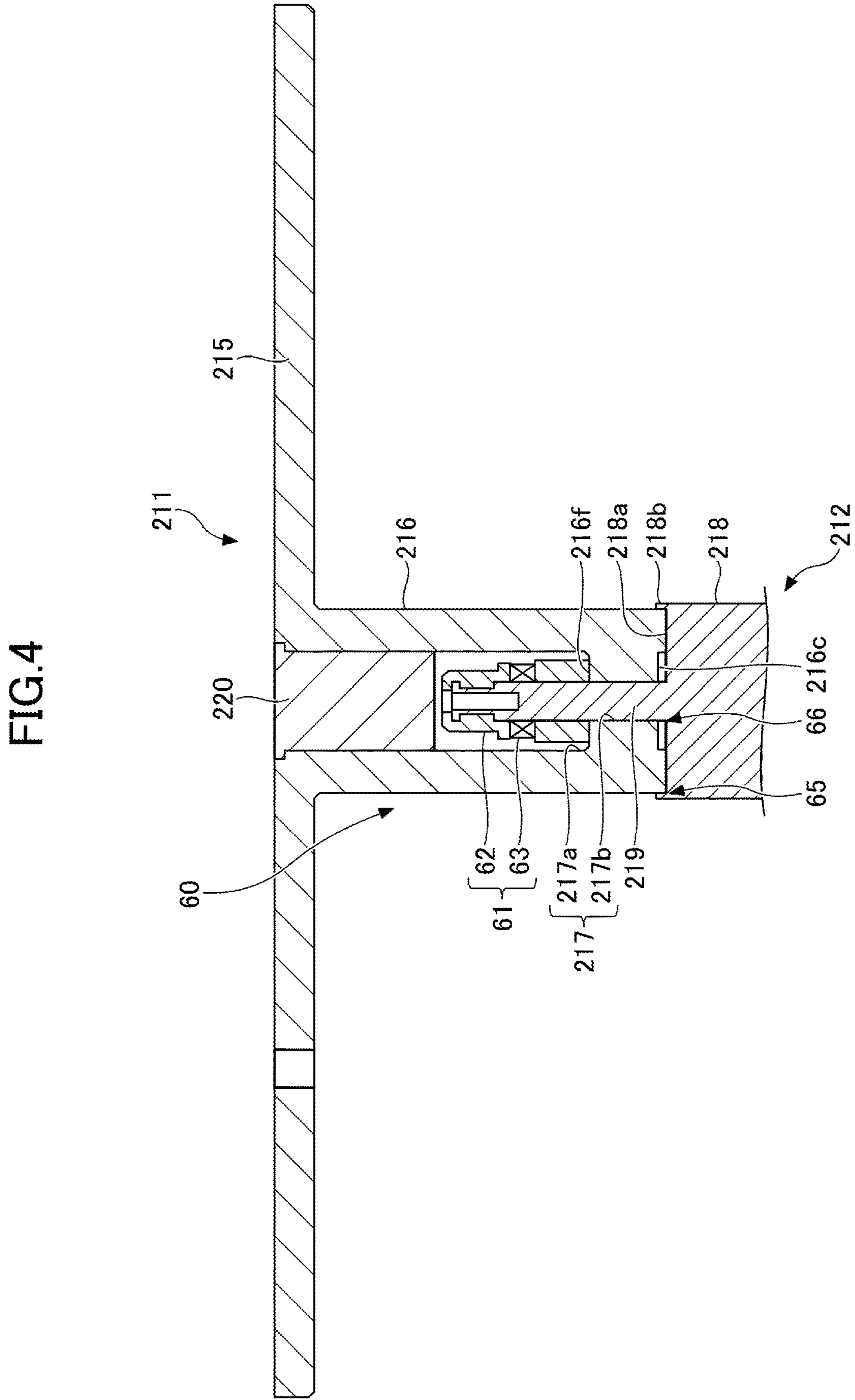
FIG. 4 is an enlarged side-cross-sectional view illustrating the stage and a rotary shaft.

FIG. 4 is an enlarged side-cross-sectional view illustrating the stage 211 and the rotation shaft 212. Next, a connection structure 60 between the stage 211 and the rotation shaft 212 will be described.

The stage 211 has a mounting portion 215 and a protruding portion 216. Additionally, the stage 211 has a hole 217 passing through the stage 211 along the axial direction (the vertical direction) of the mounting portion 215 and the protruding portion 216 at the center.

The mounting portion 215 is a disk-shaped portion of the stage 211 that has a mounting surface on which the substrate W can be directly mounted. An annular protruding portion or multiple protrusions may be formed on an outer circumferential portion of the mounting portion 215 in order to restrict displacement of the mounted substrate W in the horizontal direction.

The protruding portion 216 is connected to a central portion of a back surface (a surface opposite to the mounting surface) of the mounting portion 215 and protrudes downward in the vertical direction. The protruding portion 216 is formed in a cylindrical shape having the hole 217 therein. In the present embodiment, the mounting portion 215 and the protruding portion 216 are integrally formed, but the mounting portion 215 and the protruding portion 216 may be configured as separate members and may be connected to each other by an appropriate connection means. The protruding portion 216 of the stage 211 forms a part of the connection structure 60 for the connection to the rotation shaft 212.

The rotation shaft 212, which is a support that supports the protruding portion 216, is inserted into the protruding portion 216, such that insertion of the rotation shaft 212 is from an intermediate position of the protruding portion 216 to the lower side the protruding portion 216 in the axial direction. An inner flange 216*f* that protrudes radially inward (in a direction in which the hole 217 is narrowed) is formed on an inner circumferential surface that forms the hole 217 at the lower portion of the protruding portion 216. That is, the hole 217 has an upper space 217*a* having a first diameter above the inner flange 216*f* and a lower space 217*b* having a second diameter smaller than the first diameter at the inner flange 216*f*.

A cap 220 is inserted on the upper side of the upper space 217*a* of the hole 217. The cap 220 is formed in a columnar shape and has an outer diameter such that the cap 220 can be fitted into the hole 217. The cap 220 is mounted inside the mounting portion 215 and the protruding portion 216 to airtightly close an opening of the upper space 217*a*. This can prevent a connection member 61 and an insertion portion 219, which will be described later, from being exposed to the source gas and the reactive gas.

The outer circumferential surface of the protruding portion 216 is smoothly curved along the circumferential direction. The inner circumferential surface of the inner flange 216*f* is also smoothly curved along the circumferential direction. A portion of the protruding portion 216 where the inner flange 216*f* is formed is thicker than the other portions of the protruding portion 216. That is, the portion of the protruding portion 216 where the inner flange 216*f* is formed forms an annular portion in which the inner circumferential surface and the outer circumferential surface concentrically circle each other. Additionally, a recess 216*c* recessed upward is formed on a lower end surface of the protruding portion 216. A lower end of the hole 217 communicates with the recess 216*c*.

The rotation shaft 212 supporting the stage 211 includes a base portion 218 and an insertion portion 219. The base portion 218 is a rod member that is solid and that has a large diameter, and a lower side portion of the base portion 218 in the vertical direction is accommodated in the accommodation box 22 and connected to the rotation motor 213 (FIG. 1). The base portion 218 may be a shaft itself of the rotation motor 213. The insertion portion 219 is connected to the center of the base portion 218 and protrudes upward in the vertical direction. The base portion 218 and the insertion portion 219 are integrally formed.

An outer diameter of the base portion 218 is set to be larger than an outer diameter of the protruding portion 216 of the stage 211. At the upper end of the base portion 218, a support surface 218*a* formed in a flat shape around the insertion portion 219 and an outer edge protruding portion 218*b* protruding upward in the vertical direction at the outer edge of the support surface 218*a* are formed. The support surface 218*a* is in contact with the lower end surface of the protruding portion 216 and supports the protruding portion 216.

The outer edge protruding portion 218*b* protrudes shortly outside the outer circumferential surface of the protruding portion 216 in the radial direction. The protruding amount of the outer edge protruding portion 218*b* is greater than the recessed amount (the depth) of the recess 216*c* of the protruding portion 216, for example. The outer edge protruding portion 218*b* continuously circles on the outer edge of the base portion 218 in an annular shape, and surrounds the entire outer circumferential surface of the lower end of the protruding portion 216.

The insertion portion 219 protrudes upward in the vertical direction from the center of the base portion 218 by a predetermined length (a length shorter than the length of the protruding portion 216 of the stage 211) and is inserted and disposed in the hole 217 of the stage 211. The outer diameter of the insertion portion 219 is smaller than the outer diameter of the base portion 218. Specifically, the outer diameter of the insertion portion 219 is set smaller than the diameter of the lower space 217*b* formed by the inner circumferential surface of the inner flange 216*f* in the protruding portion 216.

The connection member 61 of the connection structure 60 is mounted in the protruding portion 216 at a position above the intermediate position in the axial direction of the insertion portion 219. By mounting the connection member 61, the stage 211 and the rotation shaft 212 are connected to each other. That is, the connection structure 60 includes the protruding portion 216 of the stage 211, the insertion portion 219 of the rotation shaft 212, and the connection member 61.

The connection member 61 is formed in a cylindrical shape, and the insertion portion 219 is accommodated inside the connection member 61. The connection member 61 includes an upper mounting portion 62 fixed to the insertion portion 219, and an elastic portion 63 configured to have an elastic force below the upper mounting portion 62.

The inner circumferential surface of the upper mounting portion 62 and the outer circumferential surface of the insertion portion 219 are formed in shapes that can be fitted to each other. As an example, the inner circumferential surface of the upper mounting portion 62 may have a bulging portion that bulges inward in the radial direction, while the outer circumferential surface of the insertion portion 219 may have a constricted portion that can be caught by the bulging portion.

The elastic portion 63 presses the inner flange 216*f* of the protruding portion 216 downward in the vertical direction in a state where the upper mounting portion 62 and the insertion portion 219 are fixed to each other. This causes the lower end surface of the protruding portion 216 of the stage 211 and the upper end surface of the base portion 218 of the rotation shaft 212 to come into firm contact with each other, so that the stage 211 can be smoothly rotated with the rotation of the rotation shaft 212. In other words, the inner flange 216*f* is sandwiched between the connection member 61 and the base portion 218, so that the protruding portion 216 is sandwiched along the axial direction of the rotation shaft 212 and the protruding portion 216.

In the above-described connection structure 60 (the stage 211, the rotation shaft 212, and the connection member 61), while the stage 211 is made of a ceramic, the rotation shaft 212 and the connection member 61 are made of a metal. The stage 211 made of a ceramic has a heat-resistant temperature characteristic for a temperature higher than a temperature during substrate processing in the film deposition apparatus 1. Additionally, examples of the metallic material forming the rotation shaft 212 include stainless steels such as SUS 304. The rotation shaft 212 made of a metal can be easily connected to the rotation motor 213.

However, in a case where the protruding portion 216 of the stage 211 is made of a ceramic and the insertion portion 219 of the rotation shaft 212 is made of a metal, a difference in thermal expansion occurs between both members. That is, while the protruding portion 216 of the stage 211 made of a ceramic has a small thermal expansion coefficient, the insertion portion 219 of the rotation shaft 212 made of a metal has a large thermal expansion coefficient. Therefore, there are differences in the shape of the protruding portion 216 and the shape of the insertion portion 219 between at the temperature in the vacuum chamber 11 before the substrate processing such as when the substrate W is set (a first temperature) and at the temperature in the vacuum chamber 11 when the temperature increases during the substrate processing (a second temperature).

For example, the first temperature before the substrate processing is in a range of 20° C. to 40° C. With respect to the above, the second temperature during the substrate processing is in a range of 300° C. to 600° C. The stage 211 and the rotation shaft 212 disposed near the heating section 15 are greatly affected by the first temperature and the second temperature.

Figures 5A, 5B:
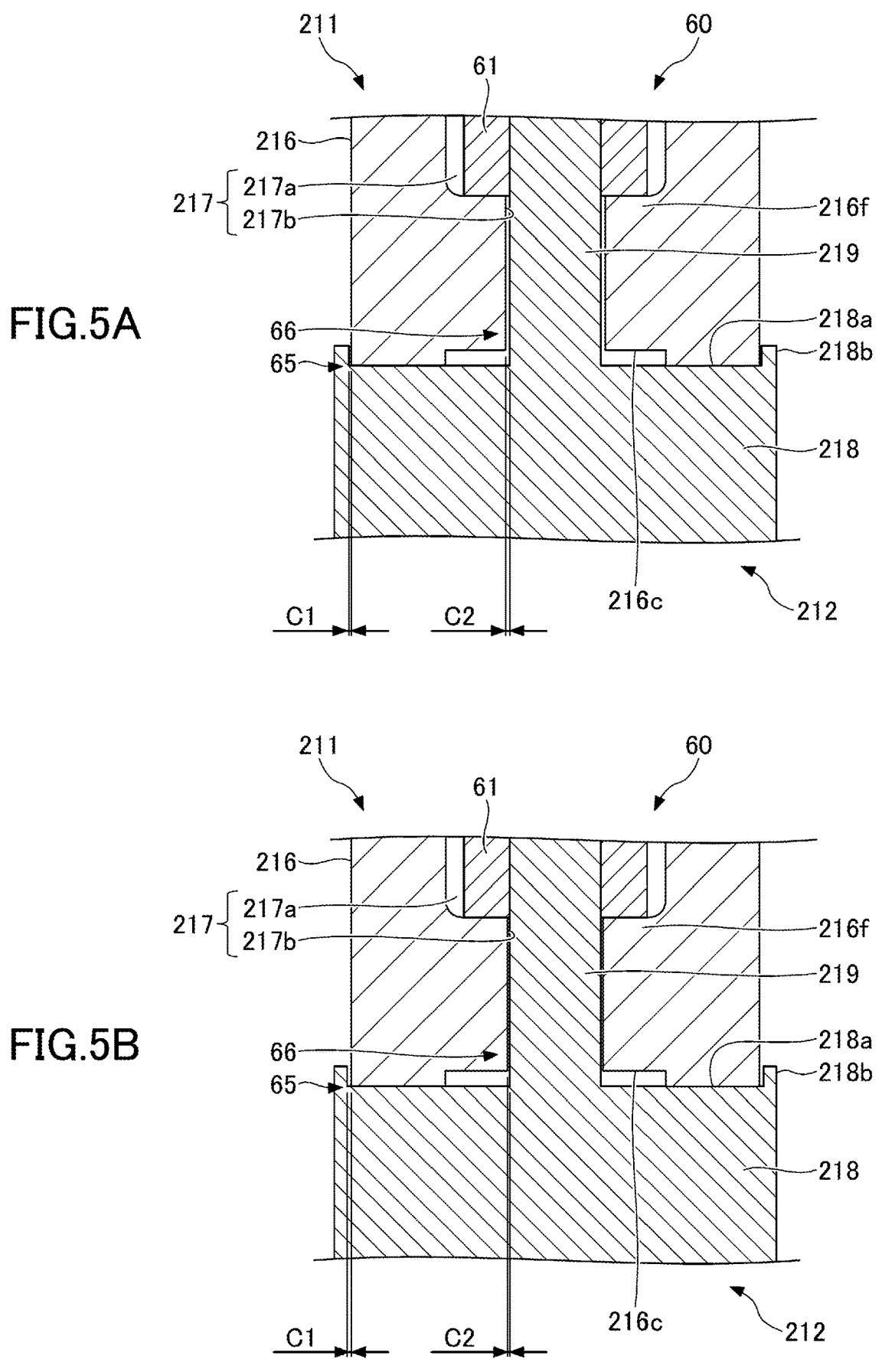

Thus, as illustrated in FIG. 5A and FIG. 5B, the connection structure 60 according to the present embodiment has a configuration in which two areas are set as fitting areas of the stage 211 and the rotation shaft 212, and centering can be performed at any one of the two fitting areas when a thermal expansion difference occurs. Specifically, a first fitting area 65 is an area where the outer circumferential surface of the protruding portion 216 of the stage 211 and the inner circumferential surface of the outer edge protruding portion 218*b* of the rotation shaft 212 face each other. A second fitting area 66 is an area where the inner circumferential surface of the inner flange 216*f* of the protruding portion 216 and the outer circumferential surface of the insertion portion 219 of the rotation shaft 212 face each other.

The first fitting area 65 is located outside the protruding portion 216. An outer clearance C1 is formed between the outer circumferential surface of the protruding portion 216 and the inner circumferential surface of the outer edge protruding portion 218*b*. The outer clearance C1 is set to be narrow at the first temperature, which is a low temperature of the vacuum chamber 11. Therefore, at the first fitting area 65, centering of the stage 211 and the rotation shaft 212 can be performed at the first temperature. The outer clearance C1 at the first temperature may be set in a range of, for example, 0.05 mm to 0.2 mm. With this configuration, at the first temperature, the protruding portion 216 can be accurately positioned with respect to the rotation shaft 212, and the axial center of the protruding portion 216 can be stably aligned with the axial center of the rotation shaft 212.

The second fitting area 66 is located inside the protruding portion 216. An inner clearance C2 is formed between the inner circumferential surface of the inner flange 216*f* of the protruding portion 216 and the outer circumferential surface of the insertion portion 219. The inner clearance C2 is set to be wider than the outer clearance C1 at the first temperature, which is a low temperature of the vacuum chamber 11. The inner clearance C2 at the first temperature may be set in a range of 0.1 mm to 0.2 mm, for example. Thus, the second fitting area 66 is an area that is not used for centering at the first temperature.

At the second temperature during the substrate processing, the rotation shaft 212 expands more than the stage 211. In the expansion of the rotation shaft 212, the insertion portion 219 is greatly deformed outward in the radial direction due to the large amount of the metal material. That is, the outer circumferential surface of the insertion portion 219 approaches the inner circumferential surface of the inner flange 216*f*. With respect to the above, the outer edge protruding portion 218*b* that protrudes at the outer edge of the base portion 218 is displaced outward by the expansion of the base portion 218 itself. That is, the inner circumferential surface of the outer edge protruding portion 218*b* becomes separated from the outer circumferential surface of the protruding portion 216.

Therefore, in the connection structure 60, the relationship between the sizes of the outer clearance C1 and the inner clearance C2 at the second temperature is reversed from the relationship between the sizes of the outer clearance C1 and the inner clearance C2 at the first temperature. Specifically, the relationship satisfying outer clearance C1<inner clearance C2 at the first temperature changes to the relationship satisfying outer clearance C1>inner clearance C2 at the second temperature. Although depending on the difference in thermal expansion between the two members, the outer clearance C1 at the second temperature may be in a range of 0.25 mm to 0.45 mm, for example, and the inner clearance C2 at the second temperature may be in a range of 0.06 mm to 0.16 mm, for example.

In other words, at the second fitting area 66, the protruding portion 216 can be accurately positioned with respect to the rotation shaft 212 at the second temperature, and the axial center of the protruding portion 216 can be stably aligned with the axial center of the rotation shaft 212. As described, the connection structure 60 can always be centered at both the low temperature and the high temperature. For example, even when the stage 211 receives a large centrifugal force due to the high-speed rotation of the rotary table 21, the film deposition apparatus 1 can satisfactorily maintain the connection state between the stage 211 and the rotation shaft 212, eliminate a looseness of fit, and significantly suppress the center runout. And then, breakage of the stage 211, the rotation shaft 212, the connection member 61, and the like due to thermal stress can be suppressed.

Here, the connection structure 60 according to the present embodiment is not limited to the connection between the stage 211 and the rotation shaft 212, and can be applied to, for example, the rotary table 21 and the connection shaft 214 provided between the rotary table 21 and the accommodation box 22. Also, in this case, the same connection structure 60 can be achieved by providing the rotary table 21 with a structure (a protruding portion) substantially the same as the protruding portion 216 of the stage 211 and by employing the connection shaft 214 with a structure (a support) substantially the same as the rotation shaft 212.

The technical idea and effects of the present disclosure described in the above embodiments will be described below.

The substrate processing apparatus (the film deposition apparatus 1) according to one embodiment of the present disclosure includes the vacuum chamber 11, the rotary table 21 rotatably provided in the vacuum chamber 11, the stage 211 that has the rotation center spaced apart from the center of the rotary table 21 and that is rotatable relative to the rotary table 21, and the support (the rotation shaft 212, the connection shaft 214, or both) that supports at least either the rotary table 21 or the stage 211 and that has a thermal expansion coefficient greater than the thermal expansion coefficient of the rotary table 21 or the stage 211 that is supported. The rotary table 21 or the stage 211 includes the protruding portion 216 protruding toward the support and the support includes the base portion 218 supporting the protruding portion 216, the insertion portion 219 protruding from the center of the base portion 218 and inserted into the protruding portion 216, and the outer edge protruding portion 218*b* protruding from the base portion 218 outside the outer circumferential surface of the protruding portion 216. The outer clearance C1 formed between the outer edge protruding portion 218*b* and the protruding portion 216 at the first temperature is set smaller than the inner clearance C2 formed between the insertion portion 219 and the protruding portion 216, and the outer clearance C1 becomes larger than the inner clearance C2 at the second temperature higher than the first temperature.

According to the above description, even when the temperature changes between the first temperature and the second temperature, the substrate processing apparatus (the film deposition apparatus 1) can position the protruding portion 216 and the support (the rotation shaft 212, the connection shaft 214, or both) at either the first fitting area 65 in the outer clearance C1 for the outer edge protruding portion 218*b* and the protruding portion 216 or the second fitting area 66 in the inner clearance C2 for the insertion portion 219 and the protruding portion 216. This can continue the centering between the protruding portion 216 and the support even if the rotary table 21 or the stage 211 is affected by a temperature change, thereby stably supporting the substrate W.

Additionally, the first temperature is in a range of 20° C. to 40° C., and the second temperature is in a range of 300° C. to 600° C. With this setting, the substrate processing apparatus (the film deposition apparatus 1) can support the substrate more stably when the substrate W is placed and when the substrate is processed.

Additionally, at the first temperature, the outer clearance C1 is in a range of 0.05 mm to 0.2 mm, and the inner clearance C2 is in a range of 0.1 mm to 0.2 mm. With this configuration, the substrate processing apparatus (the film deposition apparatus 1) may satisfactorily perform centering at the first fitting area 65 for the outer edge protruding portion 218*b* and the protruding portion 216 that form the outer clearance C1 at the first temperature.

Additionally, the protruding portion 216 is made of a ceramic, and the support (the rotation shaft 212, the connection shaft 214, or both) is made of a metal. As described above, even in the connection structure 60 including the protruding portion 216 and the support that are made of materials different from each other, the substrate W can be stably supported by performing centering at the above-described two areas.

Additionally, the protruding portion 216 is sandwiched between the connection member 61 fixed to the insertion portion 219 and the base portion 218, so that the protruding portion 216 is sandwiched in the axial direction of the protruding portion 216. With this configuration, the substrate processing apparatus (the film deposition apparatus 1) can cause the protruding portion 216 and the support (the rotation shaft 212, the connection shaft 214, or both) to be firmly fixed to each other.

The substrate processing apparatus according to the embodiments disclosed herein is illustrative in all respects and is not restrictive. The embodiments can be modified and improved in various forms without departing from the scope and spirit of the appended claims. The matters described in the above-described embodiments can also take other configurations as long as there is no contradiction, and can be combined as long as there is no contradiction.

The substrate processing apparatus of the present disclosure is not limited to the film deposition apparatus 1 that performs a film deposition process as the substrate processing, but can be applied to a substrate processing apparatus that performs an etching process, an ashing process, a cleaning process, or the like as a substrate process.

According to one aspect, the substrate can be stably supported even when the substrate is affected by a temperature change.

What is claimed is:

1. A substrate processing apparatus comprising:

a vacuum chamber;

a rotary table rotatably provided in the vacuum chamber;

a stage that has a rotation center at a position spaced apart from a rotation center of the rotary table and that is rotatable relative to the rotary table; and a support configured to support at least either the rotary table or the stage, the support having a thermal expansion coefficient greater than a thermal expansion coefficient of the rotary table or the stage that is supported, wherein the rotary table or the stage includes a protruding portion that protrudes toward the support, wherein the support includes a base portion that supports the protruding portion, an insertion portion that protrudes from a center of the base portion and that is inserted into the protruding portion, and an outer edge protruding portion that protrudes from the base portion outside an outer circumferential surface of the protruding portion, and wherein an outer clearance formed between the outer edge protruding portion and the protruding portion is set to be smaller than an inner clearance formed between the insertion portion and the protruding portion at a first temperature, and the outer clearance becomes greater than the inner clearance at a second temperature higher than the first temperature, wherein an inner circumferential surface of the outer edge protruding portion faces the outer circumferential surface of the protruding portion, and an outer circumferential surface of the insertion portion faces an inner circumferential surface of the protruding portion.

2. The substrate processing apparatus as claimed in claim 1, wherein the first temperature is in a range of 20° C. to 40° C., and wherein the second temperature is in a range of 300° C. to 600° C.

3. The substrate processing apparatus as claimed in claim 2, wherein at the first temperature, the outer clearance is in a range of 0.05 mm to 0.2 mm, and the inner clearance is in a range of 0.1 mm to 0.2 mm.

4. The substrate processing apparatus as claimed in claim 1, wherein the protruding portion is made of a ceramic, and wherein the support is made of a metal.

5. The substrate processing apparatus as claimed in claim 1, wherein the protruding portion is sandwiched between a connection member fixed to the insertion portion and the base portion, so that the protruding portion is sandwiched in an axial direction of the protruding portion.

6. The substrate processing apparatus as claimed in claim 1, wherein the outer clearance is formed between the inner circumferential surface of the outer edge protruding portion and the outer circumferential surface of the protruding portion.

* * * * *